US007588736B2

(12) United States Patent
Chen et al.

(10) Patent No.: US 7,588,736 B2
(45) Date of Patent: Sep. 15, 2009

(54) APPARATUS AND METHOD FOR GENERATING A CHEMICAL PRECURSOR

(75) Inventors: Ling Chen, Sunnyvale, CA (US); Vincent W. Ku, San Jose, CA (US); Hua Chung, San Jose, CA (US); Christophe Marcadal, Sunnyvale, CA (US); Seshadri Ganguli, Sunnyvale, CA (US); Jenny Lin, Saratoga, CA (US); Dien-Yeh Wu, San Jose, CA (US); Alan Ouye, San Mateo, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 457 days.

(21) Appl. No.: 11/383,642

(22) Filed: May 16, 2006

(65) Prior Publication Data

US 2006/0257295 A1 Nov. 16, 2006

Related U.S. Application Data

(63) Continuation of application No. 11/119,681, filed on May 2, 2005, now Pat. No. 7,270,709, which is a continuation of application No. 10/447,255, filed on May 27, 2003, now Pat. No. 6,905,541, which is a continuation-in-part of application No. 10/198,727, filed on Jul. 17, 2002, now Pat. No. 7,186,385.

(51) Int. Cl.
   *F27B 15/08* (2006.01)
(52) U.S. Cl. .................. 422/145; 422/139; 422/140; 118/715
(58) Field of Classification Search ............ 261/114.1, 261/23.1
   See application file for complete search history.

(56) References Cited

U.S. PATENT DOCUMENTS 4,058,430 A    11/1977   Suntola et al.
4,276,243 A     6/1981   Partus 4,369,031 A     1/1983   Goldman et al.

(Continued)

FOREIGN PATENT DOCUMENTS

EP    0 497 267    8/1992
EP    1 077 484    2/2001
EP    1 079 001    2/2001

(Continued)

OTHER PUBLICATIONS

Chiu, et al. "Syntheses and characterization of organoimido complexes of tantalum; potential single-source precursors to tantalum nitride," Polyhedron, vol. 17, Nos. 13-14, pp. 2187-2190, 1998.
Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc., vol. 670, Materials Research Society, (2001), pp. K2.2.1-K2.2.6.

(Continued)

*Primary Examiner*—Melvin C Mayes
*Assistant Examiner*—Melissa Stalder
(74) *Attorney, Agent, or Firm*—Patterson & Sheridan, LLP

(57) ABSTRACT

Embodiments of an apparatus for generating a chemical precursor used in a vapor deposition processing system are provide which include a canister having a sidewall, a top, and a bottom forming an interior volume which is in fluid communication with an inlet port and an outlet port. The canister contains a plurality of baffles that extend from the bottom to an upper portion of the interior volume and form an extended mean flow path between the inlet port and the outlet port. In one embodiment, the baffles are contained on a prefabricated insert positioned on the bottom of the canister. In one example, an inlet tube may extend from the inlet port into the interior region and be positioned substantially parallel to the baffles. An outlet end of the inlet tube may be adapted to direct a gas flow away from the outlet port, such as towards the sidewall or top of the canister.

51 Claims, 10 Drawing Sheets

U.S. PATENT DOCUMENTS

| | | | |
|---|---|---|---|
| 4,389,973 A | 6/1983 | Suntola et al. | |
| 4,413,022 A | 11/1983 | Suntola et al. | |
| 4,415,275 A | 11/1983 | Dietrich | |
| 4,717,596 A | 1/1988 | Barbee et al. | |
| 4,761,269 A | 8/1988 | Conger et al. | |
| 4,762,651 A * | 8/1988 | Parker et al. | 261/114.1 |
| 4,783,343 A | 11/1988 | Sato | |
| 4,817,557 A | 4/1989 | Diem et al. | |
| 4,834,831 A | 5/1989 | Nishizawa et al. | |
| 4,898,118 A * | 2/1990 | Murakami et al. | 118/723 ME |
| 4,911,101 A | 3/1990 | Ballingall, III et al. | |
| 4,975,252 A | 12/1990 | Nishizawa et al. | |
| 4,993,357 A | 2/1991 | Scholz | |
| 5,000,113 A | 3/1991 | Wang et al. | |
| 5,027,746 A | 7/1991 | Frijlink | |
| 5,098,741 A | 3/1992 | Nolet et al. | |
| 5,173,327 A | 12/1992 | Sandhu et al. | |
| 5,178,681 A | 1/1993 | Moore et al. | |
| 5,188,808 A | 2/1993 | Lilja et al. | |
| 5,221,449 A | 6/1993 | Colgan et al. | |
| 5,225,251 A | 7/1993 | Esrom | |
| 5,225,366 A | 7/1993 | Yoder | |
| 5,261,959 A | 11/1993 | Gasworth | |
| 5,281,274 A | 1/1994 | Yoder | |
| 5,281,485 A | 1/1994 | Colgan et al. | |
| 5,294,286 A | 3/1994 | Nishizawa et al. | |
| 5,338,362 A | 8/1994 | Imahashi | |
| 5,354,516 A | 10/1994 | Tomita | |
| 5,374,570 A | 12/1994 | Nasu et al. | |
| 5,377,429 A | 1/1995 | Sandhu et al. | |
| 5,381,605 A | 1/1995 | Krafft | |
| 5,441,703 A | 8/1995 | Jurgensen | |
| 5,443,647 A | 8/1995 | Aucoin et al. | |
| 5,480,818 A | 1/1996 | Matsumoto et al. | |
| 5,483,919 A | 1/1996 | Yokoyama et al. | |
| 5,496,408 A | 3/1996 | Motoda et al. | |
| 5,503,875 A | 4/1996 | Imai et al. | |
| 5,558,717 A | 9/1996 | Zhao et al. | |
| 5,595,603 A | 1/1997 | Klinedinst et al. | |
| 5,620,524 A | 4/1997 | Fan et al. | |
| 5,630,878 A | 5/1997 | Miyamoto et al. | |
| 5,645,642 A | 7/1997 | Nishizato et al. | |
| 5,674,574 A | 10/1997 | Atwell et al. | |
| 5,674,786 A | 10/1997 | Turner et al. | |
| 5,711,811 A | 1/1998 | Suntola et al. | |
| 5,730,802 A | 3/1998 | Ishizumi et al. | |
| 5,764,849 A | 6/1998 | Atwell | |
| 5,796,116 A | 8/1998 | Nakata et al. | |
| 5,807,792 A | 9/1998 | Ilg et al. | |
| 5,820,678 A | 10/1998 | Hubert et al. | |
| 5,835,677 A | 11/1998 | Li et al. | |
| 5,846,332 A | 12/1998 | Zhao et al. | |
| 5,855,680 A | 1/1999 | Soininen et al. | |
| 5,879,459 A | 3/1999 | Gadgil et al. | |
| 5,882,411 A | 3/1999 | Zhao et al. | |
| 5,882,416 A * | 3/1999 | Van Buskirk et al. | 118/726 |
| 5,906,683 A | 5/1999 | Chen et al. | |
| 5,916,365 A | 6/1999 | Sherman | |
| 5,923,056 A | 7/1999 | Lee et al. | |
| 5,942,089 A | 8/1999 | Sproul et al. | |
| 5,951,771 A | 9/1999 | Raney et al. | |
| 5,966,499 A | 10/1999 | Hinkle et al. | |
| 5,968,588 A | 10/1999 | Sivaramakrishnan et al. | |
| 5,972,430 A | 10/1999 | DiMeo, Jr. et al. | |
| 6,015,590 A | 1/2000 | Suntola et al. | |
| 6,015,595 A | 1/2000 | Felts | |
| 6,015,917 A | 1/2000 | Bhandari et al. | |
| 6,042,652 A | 3/2000 | Hyun et al. | |
| 6,066,358 A | 5/2000 | Guo et al. | |
| 6,071,572 A | 6/2000 | Mosely et al. | |
| 6,077,396 A | 6/2000 | LaRiviere | |
| 6,079,356 A | 6/2000 | Umotoy et al. | |
| 6,084,302 A | 7/2000 | Sandhu | |
| 6,099,904 A | 8/2000 | Mak et al. | |
| 6,107,198 A | 8/2000 | Lin et al. | |
| 6,124,158 A | 9/2000 | Dautartas et al. | |
| 6,136,725 A | 10/2000 | Loan et al. | |
| 6,139,640 A | 10/2000 | Ramos et al. | |
| 6,139,700 A | 10/2000 | Kang et al. | |
| 6,143,080 A | 11/2000 | Bartholomew et al. | |
| 6,143,082 A | 11/2000 | McInerney et al. | |
| 6,144,060 A | 11/2000 | Park et al. | |
| 6,156,382 A | 12/2000 | Rajagopalan et al. | |
| 6,162,488 A | 12/2000 | Gevelber et al. | |
| 6,162,715 A | 12/2000 | Mak et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,487 B1 | 3/2001 | Kim et al. | |
| 6,224,681 B1 | 5/2001 | Sivaramakrishnan et al. | |
| 6,231,672 B1 | 5/2001 | Choi et al. | |
| 6,248,434 B1 | 6/2001 | Rodiger et al. | |
| 6,251,190 B1 | 6/2001 | Mak et al. | |
| 6,270,572 B1 | 8/2001 | Kim et al. | |
| 6,271,148 B1 | 8/2001 | Kao et al. | |
| 6,284,646 B1 | 9/2001 | Leem | |
| 6,302,965 B1 | 10/2001 | Umotoy et al. | |
| 6,305,314 B1 | 10/2001 | Sneh et al. | |
| 6,306,216 B1 | 10/2001 | Kim et al. | |
| 6,309,713 B1 | 10/2001 | Mak et al. | |
| 6,328,221 B1 | 12/2001 | Moore et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,416,577 B1 | 7/2002 | Suntola et al. | |
| 6,416,822 B1 | 7/2002 | Chiang et al. | |
| 6,428,859 B1 | 8/2002 | Chiang et al. | |
| 6,433,314 B1 | 8/2002 | Mandrekar et al. | |
| 6,447,607 B2 | 9/2002 | Soininen et al. | |
| 6,451,119 B2 | 9/2002 | Sneh et al. | |
| 6,451,695 B2 | 9/2002 | Sneh | |
| 6,454,860 B2 | 9/2002 | Metzner et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,481,945 B1 | 11/2002 | Hasper et al. | |
| 6,482,262 B1 | 11/2002 | Elers et al. | |
| 6,482,733 B2 | 11/2002 | Raaijmakers et al. | |
| 6,511,539 B1 | 1/2003 | Raaijmakers | |
| 6,524,952 B1 | 2/2003 | Srinivas et al. | |
| 6,548,112 B1 | 4/2003 | Hillman et al. | |
| 6,551,406 B2 | 4/2003 | Kilpi | |
| 6,551,929 B1 | 4/2003 | Kori et al. | |
| 6,561,498 B2 | 5/2003 | Tompkins et al. | |
| 6,569,501 B2 | 5/2003 | Chiang et al. | |
| 6,572,705 B1 | 6/2003 | Suntola et al. | |
| 6,578,287 B2 | 6/2003 | Aswad | |
| 6,579,372 B2 | 6/2003 | Park | |
| 6,585,823 B1 | 7/2003 | Van Wijck | |
| 6,593,484 B2 | 7/2003 | Yasuhara et al. | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,630,030 B1 | 10/2003 | Suntola et al. | |

| | | | | | |
|---|---|---|---|---|---|
| 6,630,201 B2 * | 10/2003 | Chiang et al. ......... 427/255.28 | 2002/0076507 A1 | 6/2002 | Chiang et al. |
| 6,632,279 B1 | 10/2003 | Ritala et al. | 2002/0076508 A1 | 6/2002 | Chiang et al. |
| 6,660,126 B2 | 12/2003 | Nguyen et al. | 2002/0076837 A1 | 6/2002 | Hujanen et al. |
| 6,716,287 B1 | 4/2004 | Santiago et al. | 2002/0086106 A1 | 7/2002 | Park et al. |
| 6,718,126 B2 * | 4/2004 | Lei ............................ 392/388 | 2002/0086111 A1 | 7/2002 | Byun et al. |
| 6,720,027 B2 | 4/2004 | Yang et al. | 2002/0086507 A1 | 7/2002 | Park et al. |
| 6,730,267 B2 | 5/2004 | Stringer et al. | 2002/0092471 A1 | 7/2002 | Kang et al. |
| 6,734,020 B2 | 5/2004 | Lu et al. | 2002/0094689 A1 | 7/2002 | Park |
| 6,772,072 B2 | 8/2004 | Ganguli et al. | 2002/0098627 A1 | 7/2002 | Pomarede et al. |
| 6,773,507 B2 | 8/2004 | Jallepally et al. | 2002/0104481 A1 | 8/2002 | Chiang et al. |
| 6,777,352 B2 | 8/2004 | Tepman et al. | 2002/0106536 A1 | 8/2002 | Lee et al. |
| 6,778,762 B1 | 8/2004 | Shareef et al. | 2002/0106846 A1 | 8/2002 | Seutter et al. |
| 6,784,096 B2 | 8/2004 | Chen et al. | 2002/0108570 A1 | 8/2002 | Lindfors |
| 6,790,773 B1 | 9/2004 | Drewery et al. | 2002/0110991 A1 | 8/2002 | Li |
| 6,797,108 B2 | 9/2004 | Wendling | 2002/0115886 A1 | 8/2002 | Yasuhara et al. |
| 6,800,173 B2 | 10/2004 | Chiang et al. | 2002/0117399 A1 | 8/2002 | Chen et al. |
| 6,803,272 B1 | 10/2004 | Halliyal et al. | 2002/0121241 A1 | 9/2002 | Nguyen et al. |
| 6,815,285 B2 | 11/2004 | Choi et al. | 2002/0121342 A1 | 9/2002 | Nguyen et al. |
| 6,818,094 B2 | 11/2004 | Yudovsky | 2002/0127336 A1 | 9/2002 | Chen et al. |
| 6,821,563 B2 | 11/2004 | Yudovsky | 2002/0127745 A1 | 9/2002 | Lu et al. |
| 6,827,815 B2 | 12/2004 | Hytros et al. | 2002/0132473 A1 | 9/2002 | Chiang et al. |
| 6,838,125 B2 | 1/2005 | Chung et al. | 2002/0134307 A1 | 9/2002 | Choi |
| 6,866,746 B2 | 3/2005 | Lei et al. | 2002/0144655 A1 | 10/2002 | Chiang et al. |
| 6,866,951 B2 | 3/2005 | Foley et al. | 2002/0144657 A1 | 10/2002 | Chiang et al. |
| 6,868,859 B2 | 3/2005 | Yudovsky | 2002/0145210 A1 | 10/2002 | Tompkins et al. |
| 6,878,206 B2 | 4/2005 | Tzu et al. | 2002/0146511 A1 | 10/2002 | Chiang et al. |
| 6,881,437 B2 | 4/2005 | Ivanov et al. | 2002/0155722 A1 | 10/2002 | Satta et al. |
| 6,893,915 B2 | 5/2005 | Park et al. | 2002/0162506 A1 | 11/2002 | Sneh et al. |
| 6,902,624 B2 | 6/2005 | Seidel et al. | 2002/0164421 A1 | 11/2002 | Chiang et al. |
| 6,905,541 B2 | 6/2005 | Chen et al. | 2002/0164423 A1 | 11/2002 | Chiang et al. |
| 6,911,093 B2 | 6/2005 | Stacey et al. | 2002/0177282 A1 | 11/2002 | Song et al. |
| 6,921,062 B2 | 7/2005 | Gregg et al. | 2002/0182320 A1 | 12/2002 | Leskela et al. |
| 6,936,906 B2 * | 8/2005 | Chung et al. ................ 257/486 | 2002/0187256 A1 | 12/2002 | Elers et al. |
| 6,946,033 B2 | 9/2005 | Tsuei et al. | 2002/0197402 A1 | 12/2002 | Chiang et al. |
| 6,983,892 B2 | 1/2006 | Noorbakhsh et al. | 2003/0004723 A1 | 1/2003 | Chihara |
| 6,998,014 B2 | 2/2006 | Chen et al. | 2003/0010451 A1 | 1/2003 | Tzu et al. |
| 7,270,709 B2 * | 9/2007 | Chen et al. .................. 117/201 | 2003/0013320 A1 | 1/2003 | Kim et al. |
| 2001/0000866 A1 | 5/2001 | Sneh et al. | 2003/0017697 A1 | 1/2003 | Choi et al. |
| 2001/0002280 A1 | 5/2001 | Sneh | 2003/0022338 A1 | 1/2003 | Ruben et al. |
| 2001/0003603 A1 | 6/2001 | Eguchi et al. | 2003/0023338 A1 | 1/2003 | Chin et al. |
| 2001/0009140 A1 | 7/2001 | Bondestam et al. | 2003/0031807 A1 | 2/2003 | Elers et al. |
| 2001/0009695 A1 | 7/2001 | Saanila et al. | 2003/0038369 A1 | 2/2003 | Layadi et al. |
| 2001/0011526 A1 | 8/2001 | Doering et al. | 2003/0042630 A1 | 3/2003 | Babcoke et al. |
| 2001/0013312 A1 | 8/2001 | Soininen et al. | 2003/0049375 A1 | 3/2003 | Nguyen et al. |
| 2001/0014371 A1 | 8/2001 | Kilpi | 2003/0049931 A1 | 3/2003 | Byun et al. |
| 2001/0024387 A1 | 9/2001 | Raaijmakers et al. | 2003/0049942 A1 | 3/2003 | Haukka et al. |
| 2001/0025979 A1 | 10/2001 | Kim et al. | 2003/0053799 A1 | 3/2003 | Lei |
| 2001/0028924 A1 | 10/2001 | Sherman | 2003/0057526 A1 | 3/2003 | Chung et al. |
| 2001/0034123 A1 | 10/2001 | Jeon et al. | 2003/0057527 A1 | 3/2003 | Chung et al. |
| 2001/0041250 A1 | 11/2001 | Werkhoven et al. | 2003/0059538 A1 | 3/2003 | Chung et al. |
| 2001/0042523 A1 | 11/2001 | Kesala | 2003/0072913 A1 | 4/2003 | Chou et al. |
| 2001/0042799 A1 | 11/2001 | Kim et al. | 2003/0072975 A1 | 4/2003 | Shero et al. |
| 2001/0054377 A1 | 12/2001 | Lindfors et al. | 2003/0075273 A1 | 4/2003 | Kilpela et al. |
| 2001/0054730 A1 | 12/2001 | Kim et al. | 2003/0075925 A1 | 4/2003 | Lindfors et al. |
| 2001/0054769 A1 | 12/2001 | Raaijmakers et al. | 2003/0079686 A1 | 5/2003 | Chen et al. |
| 2002/0000196 A1 | 1/2002 | Park | 2003/0082296 A1 | 5/2003 | Elers et al. |
| 2002/0000598 A1 | 1/2002 | Kang et al. | 2003/0082301 A1 | 5/2003 | Chen et al. |
| 2002/0007790 A1 | 1/2002 | Park | 2003/0082307 A1 | 5/2003 | Chung et al. |
| 2002/0009544 A1 | 1/2002 | McFeely et al. | 2003/0089308 A1 | 5/2003 | Raaijmakers |
| 2002/0009896 A1 | 1/2002 | Sandhu et al. | 2003/0101927 A1 | 6/2003 | Raaijmakers |
| 2002/0013051 A1 | 1/2002 | Hautala et al. | 2003/0101938 A1 | 6/2003 | Ronsse et al. |
| 2002/0017242 A1 | 2/2002 | Hamaguchi et al. | 2003/0106490 A1 | 6/2003 | Jallepally et al. |
| 2002/0020869 A1 | 2/2002 | Park et al. | 2003/0108674 A1 | 6/2003 | Chung et al. |
| 2002/0021544 A1 | 2/2002 | Cho et al. | 2003/0113187 A1 | 6/2003 | Lei et al. |
| 2002/0031618 A1 | 3/2002 | Sherman | 2003/0116087 A1 | 6/2003 | Nguyen et al. |
| 2002/0041931 A1 | 4/2002 | Suntola et al. | 2003/0121241 A1 | 7/2003 | Belke |
| 2002/0048635 A1 | 4/2002 | Kim et al. | 2003/0121469 A1 | 7/2003 | Lindfors et al. |
| 2002/0052097 A1 | 5/2002 | Park | 2003/0121608 A1 | 7/2003 | Chen et al. |
| 2002/0060363 A1 | 5/2002 | Xi et al. | 2003/0124262 A1 | 7/2003 | Chen et al. |
| 2002/0066411 A1 | 6/2002 | Chiang et al. | 2003/0140854 A1 | 7/2003 | Kilpi |
| 2002/0068458 A1 | 6/2002 | Chiang et al. | 2003/0143328 A1 | 7/2003 | Chen et al. |
| 2002/0073924 A1 | 6/2002 | Chiang et al. | 2003/0143747 A1 | 7/2003 | Bondestam et al. |
| 2002/0076481 A1 | 6/2002 | Chiang et al. | 2003/0153177 A1 | 8/2003 | Tepman et al. |

| | | |
|---|---|---|
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0077183 A1 | 4/2004 | Chung et al. |
| 2004/0144308 A1 | 7/2004 | Yudovsky |
| 2004/0144311 A1 | 7/2004 | Chen et al. |
| 2004/0187304 A1 | 9/2004 | Chen et al. |
| 2004/0203254 A1 | 10/2004 | Conley, Jr. et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0253375 A1 | 12/2004 | Ivanov et al. |
| 2004/0256351 A1 | 12/2004 | Chung et al. |
| 2005/0006799 A1 | 1/2005 | Gregg et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0095859 A1 | 5/2005 | Chen et al. |
| 2005/0104142 A1 | 5/2005 | Narayanan et al. |
| 2005/0153571 A1 | 7/2005 | Senzaki |
| 2005/0189072 A1 | 9/2005 | Chen et al. |
| 2005/0233156 A1 | 10/2005 | Senzaki et al. |
| 2005/0255243 A1 | 11/2005 | Senzaki |

FOREIGN PATENT DOCUMENTS

| | | |
|---|---|---|
| EP | 1 167 569 | 1/2002 |
| GB | 2 151 662 | 7/1985 |
| GB | 2 223 509 | 4/1990 |
| GB | 2 355 727 | 5/2001 |
| JP | 56-035426 | 4/1981 |
| JP | 58-098917 | 6/1983 |
| JP | 01-175225 | 7/1989 |
| JP | 04-291916 | 9/1992 |
| JP | 05-206036 | 8/1993 |
| JP | 05-234899 | 9/1993 |
| JP | 05-270997 | 10/1993 |
| JP | 06-224138 | 5/1994 |
| JP | 06-317520 | 11/1994 |
| JP | 07-300649 | 11/1995 |
| JP | 05-047666 | 2/1996 |
| JP | 2000-122725 | 4/2000 |
| JP | 2000-319772 | 11/2000 |
| JP | 2001-020075 | 1/2001 |
| JP | 2001-111000 | 4/2001 |
| JP | 2001-172767 | 6/2001 |
| JP | 2000-212752 | 11/2002 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/16377 | 3/2000 |
| WO | WO 00/54320 | 9/2000 |
| WO | WO 00/79575 | 12/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 02/01628 | 1/2002 |
| WO | WO 02/08485 | 1/2002 |
| WO | WO 02/08488 | 1/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO 03/004723 | 1/2003 |
| WO | WO 03/023835 | 3/2003 |
| WO | WO 2004/008491 | 1/2004 |

OTHER PUBLICATIONS

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461), 2001, pp. 207-209.

Goswami, et al. Transition Metals Show Promise as Copper Barriers, Semiconductor International, ATMI, San Jose—May 1, 2004.

Hartje, et al. "CVD reactor source—has irradiated surface to vaporize surface of reaction component held solid by internal cooling," Patent No. DD 274057, Dec. 6, 1989, AKAD Wissenschaften DDR, Derwent WPI File, Record No. 008261396, Abstract.

Hiltunen, et al. "Nitrides of Titanium, Niobium, Tantalum and Molybdenum Grown as Thin Films by the Atomic Layer Epitaxy Method," Think Solid Films, vol. 166, (1988), pp. 149-154.

Hong, et al. "Characteristics of PAALD-TaN thin films derived from TAIMATA precursor for copper metallization," Internconnect Technology Conference, 2004, Proceedings of the IEEE 2004 International, Jun. 7-9, 2004, pp. 9-11.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-306.

Kukli, et al. "Tailoring the Dielectric Properties of $HfO_2$-$Ta_2$-$O_5$ Nanolaminates," Applied Physics Letters, vol. 68, No. 26, Jun. 24, 1996; p. 3737-3739.

Leskela, et al. "Atomic Layer Epitaxy in Deposition of Various Oxide and Nitride Thin Films," Journal De Physique IV, Colloque C5, Supplement au Journal de Physique II, vol. 5, Jun. 1995, pp. C5-937-C5-951.

NEC Corp. "Gasifier for sublimation for CVD unit—has container for solid material, $1^{st}$ heater, $2^{nd}$ heater to heat gas trapped by mesh structure, etc.," Patent No. 5-214537, Aug. 24, 1993, Derwent WPI File, Record No. 009606474, Abstract.

Niinisto, et al. "Synthesis of Oxide Thin Films and Overlayers by Atomic Layer Epitaxy for Advanced Applications," Materials Science and Engineering B41 (1996), 23-29.

Pamplin "Crystal Growth," MBE-Molecular Beam Epitaxial Evaporative Growth, Pergamon Press, Sec. Edition, vol. 16, 1981, pp. 227-229.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

PCT International Preliminary Report on Patentability and, Written Opinion dated Dec. 1, 2005 for International Application No. PCT/US2004/016715.

PCT International Search Report and the Written Opinion dated Apr. 14, 2004 for International Application No. PCT/US2003/22186.

PCT International Search Report and the Written Opinion dated Nov. 2, 2004 for International Application No. PCT/US2004/016715.

PCT International Search Report dated Feb. 16, 2003 for International Application No. PCT/US02/02651.

PCT International Search Report dated May 8, 2003 for International Application No. PCT/US02/34553.

PCT International Search Report dated May 9, 2003 for International Application No. PCT/US02/34277.

Ravetz, et al. "Properties of Solution TMI™ as an OMVPE Source," J. Electron. Mater. (USA) vol. 29, No. 1, Jan. 2000, pp. 156-160.

Ritala, et al. "Controlled Growth of TaN, $Ta_3N_5$, and $TaO_xN_y$ Thin Films by Atomic Layer Deposition," Chem. Mater., vol. 11, No. 7, 1999, pp. 1712-1718.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Rossnagel, et al. "Plasma-Enhanced Atomic Layer Deposition of Ta and Ti for Interconnect Diffusion Barriers," J. Vac. Sci. Technol. B 18(4), Jul./Aug. 2000, pp. 2016-2020.

Shenai, et al. "Correlation of vapor pressure equation and film properties with trimethylindium purity for the MOVPE grown III-V compounds," Journal of Crystal Growth 248 (2003) pp. 91-98.

Sigma-Aldrich Certificate of Analysis, http://infonew.sigma-aldrich.com/cgi-bin/gx.cgi/Applogic+COfAInfo/Start?ProductNo=49..., dated Mar. 16, 2003.

* cited by examiner

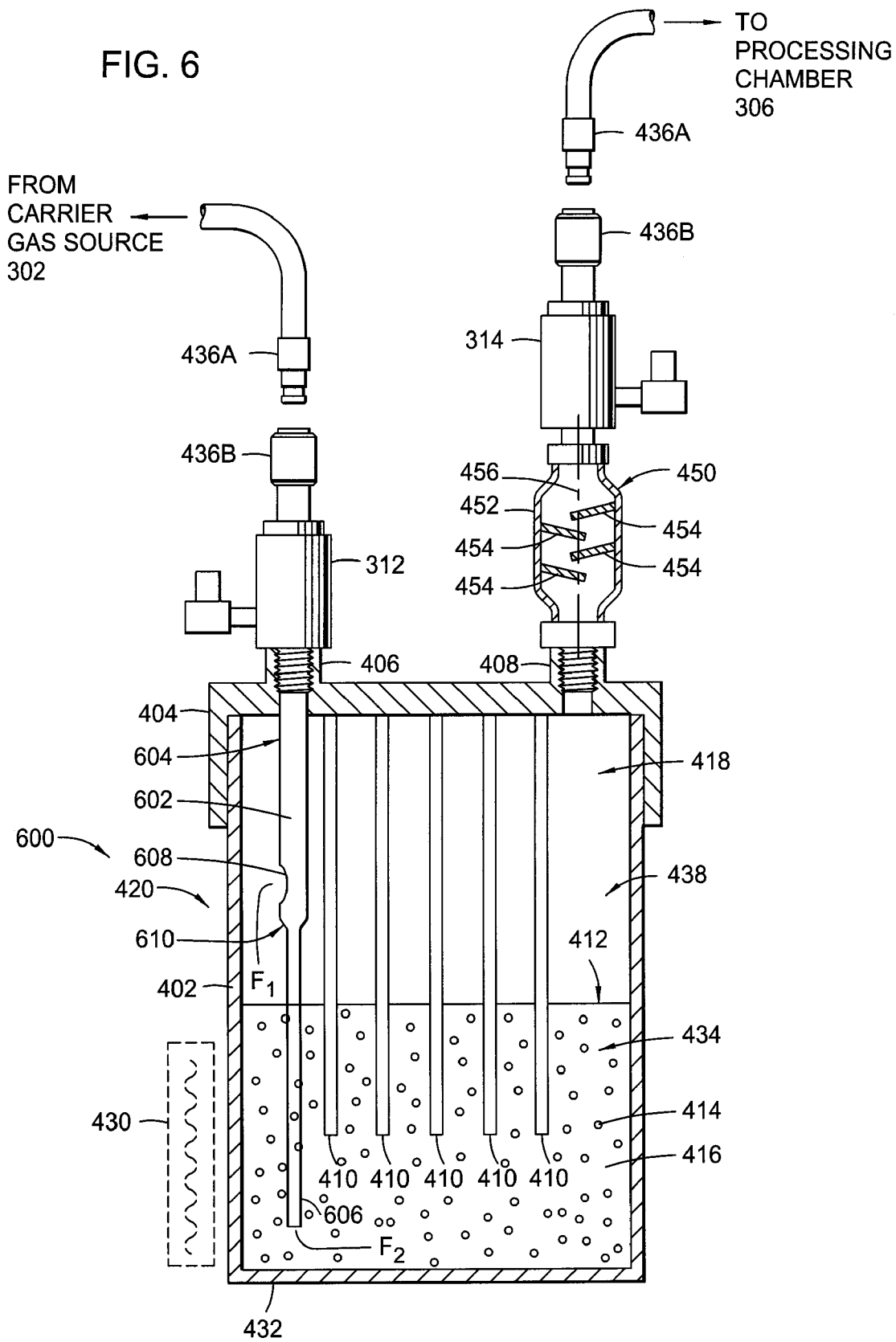

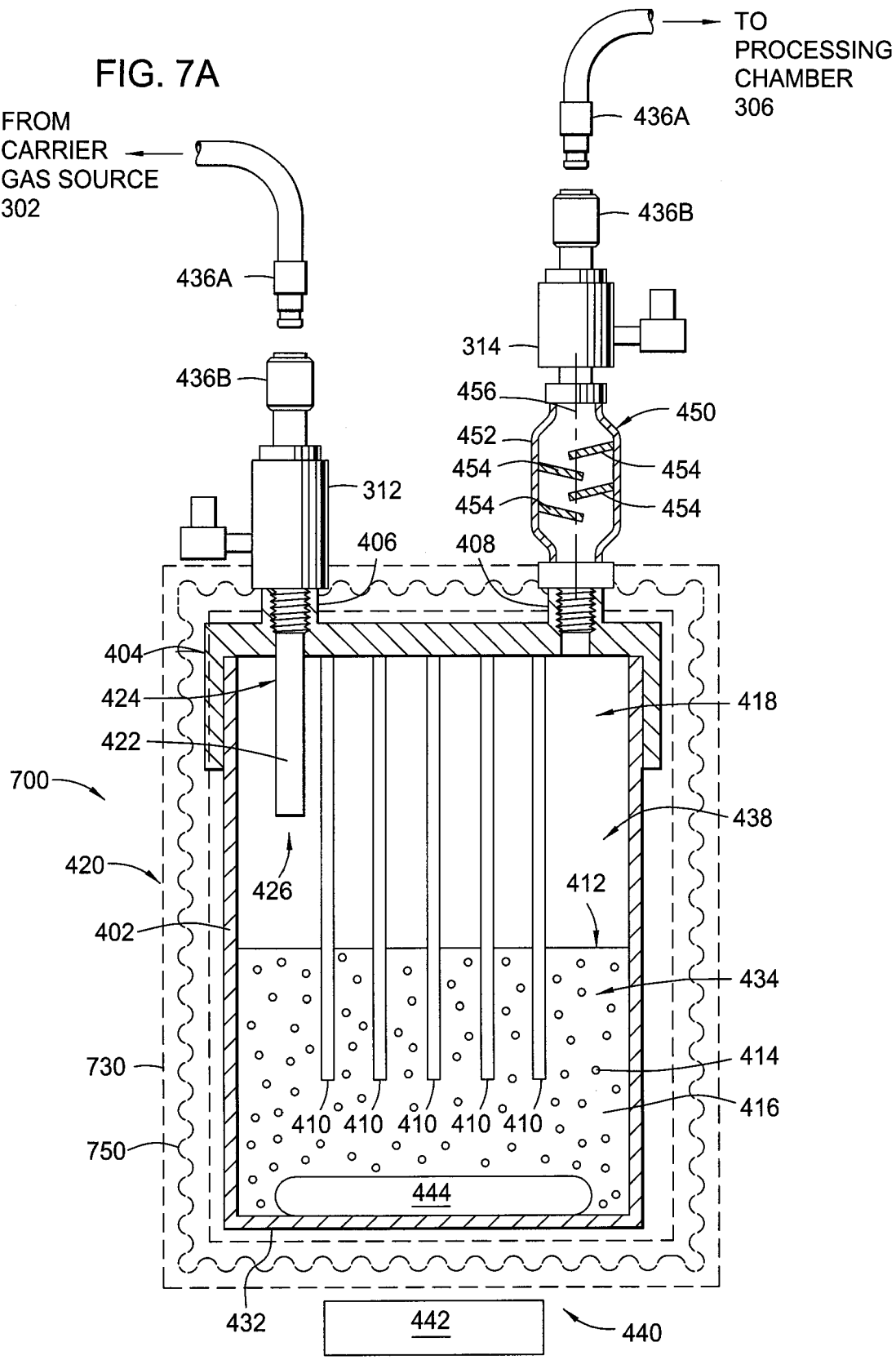

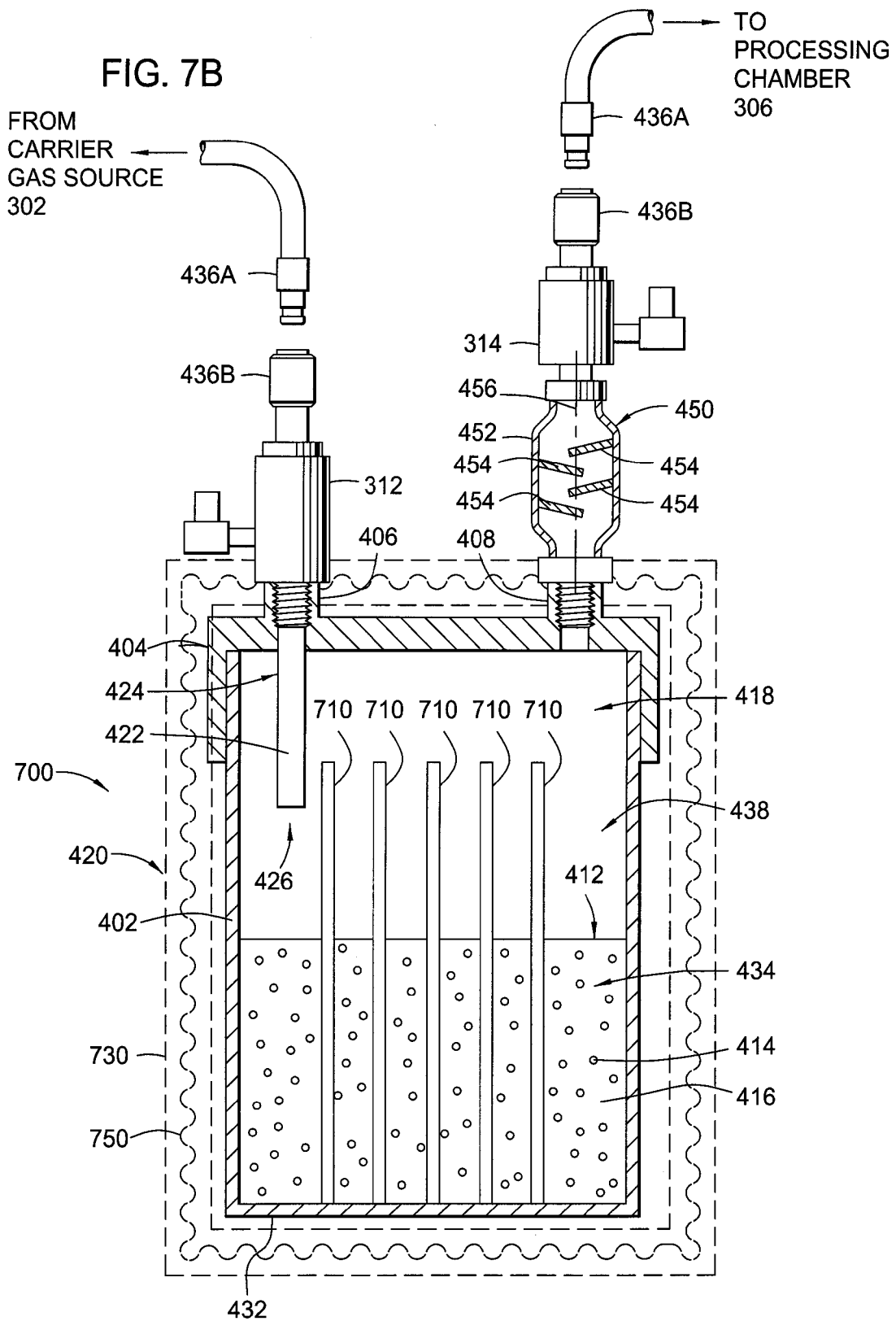

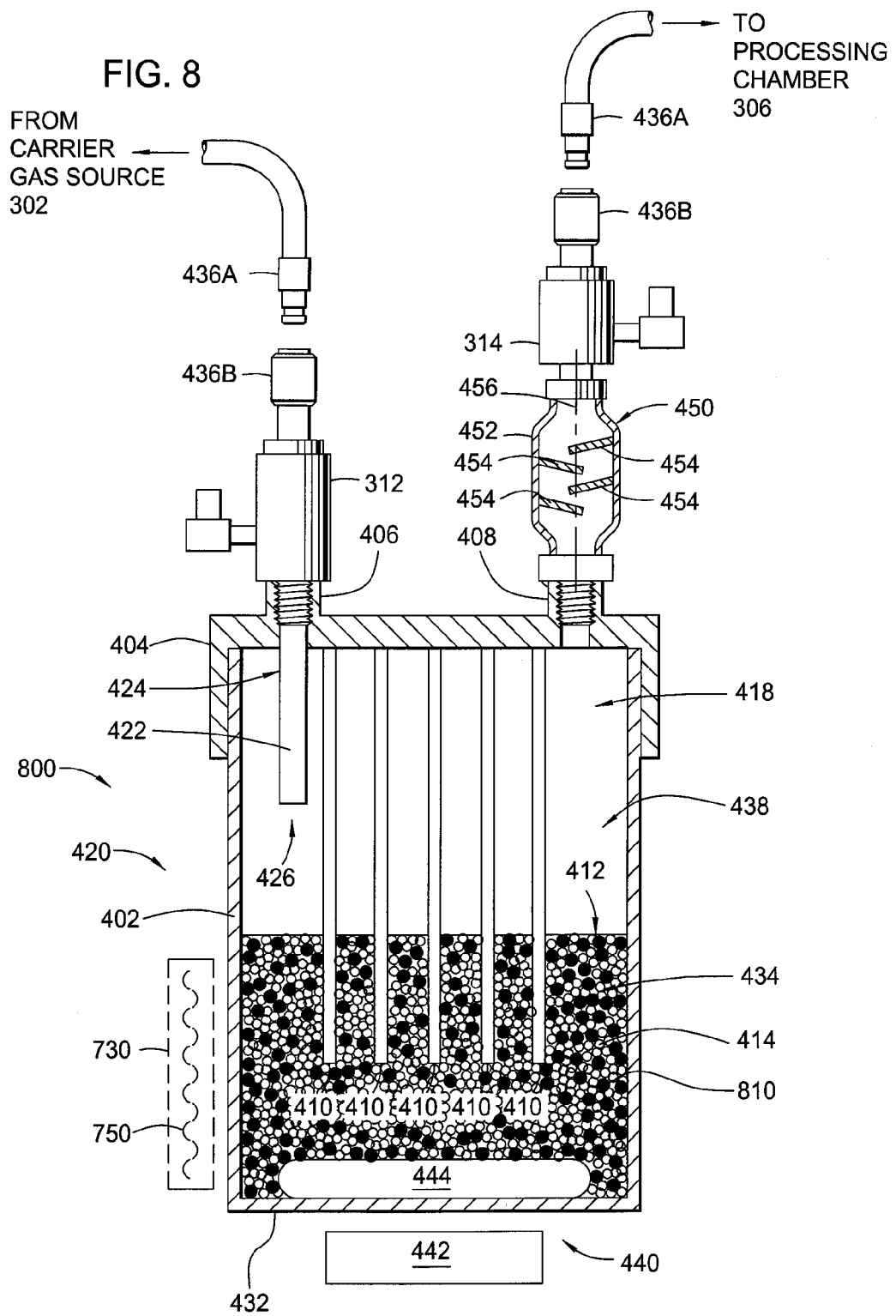

APPARATUS AND METHOD FOR GENERATING A CHEMICAL PRECURSOR

CROSS-REFERENCE TO RELATED APPLICATIONS

This application is a continuation of U.S. Ser. No. 11/119,681, filed May 2, 2005, now U.S. Pat. No. 7,270,709, which is a continuation of U.S. Ser. No. 10/447,255, filed May 27, 2003, issued as U.S. Pat. No. 6,905,541, which is a continuation-in-part of U.S. Ser. No. 10/198,727, filed Jul. 17, 2002, now. U.S. Patent No. 7,186,385, which are all incorporated herein by reference in their entirety.

BACKGROUND OF THE INVENTION

1. Field of the Invention

Embodiments of the invention generally relate to apparatuses and processes for generating a chemical precursor that may be used during a vapor deposition process.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions (e.g., about 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Currently, copper and its alloys have become the metals of choice for sub-micron interconnect technology because copper has a lower resistivity than aluminum, (about 1.7 $\mu\Omega$-cm compared to about 3.1 $\mu\Omega$-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Copper metallization can be achieved by a variety of techniques. A typical method generally includes physical vapor depositing a barrier layer over a feature, physical vapor depositing a copper seed layer over the barrier layer, and then electroplating a copper conductive material layer over the copper seed layer to fill the feature. Finally, the deposited layers and the dielectric layers are planarized, such as by chemical mechanical polishing (CMP), to define a conductive interconnect feature.

However, one problem with the use of copper is that copper diffuses into silicon, silicon dioxide, and other dielectric materials which may compromise the integrity of devices. Therefore, conformal barrier layers become increasingly important to prevent copper diffusion. Tantalum nitride has been used as a barrier material to prevent the diffusion of copper into underlying layers. However, the chemicals used in the barrier layer deposition, such as pentakis(dimethylamido)tantalum (PDMAT; $Ta[N(CH_3)_2]_5$), may include impurities that cause defects in the fabrication of semiconductor devices and reduce process yields. Therefore, there exists a need for a method of depositing a barrier layer from a high-purity precursor.

SUMMARY OF THE INVENTION

Embodiments of the present invention include a method for filling a feature in a substrate. In one embodiment, the method includes depositing a barrier layer formed from purified pentakis(dimethylamido)tantalum having less than about 5 ppm of chlorine. The method additionally may include depositing a seed layer over the barrier layer and depositing a conductive layer over the seed layer.

Embodiments of the present invention further include a canister for vaporizing PDMAT prior to depositing a tantalum nitride layer on a substrate. The canister includes a sidewall, a top portion and a bottom portion. The canister contains an interior volume having an upper region and a lower region. A heater surrounds the canister, in which the heater creates a temperature gradient between the upper region and the lower region.

Embodiments of the present invention further include purified pentakis(dimethylamido)tantalum having less than about 5 ppm of chlorine.

BRIEF DESCRIPTION OF THE DRAWINGS

So that the manner in which the above recited features of the present invention are attained and can be understood in detail, a more particular description of the invention, briefly summarized above, may be had by reference to the embodiments thereof, which are illustrated in the appended drawings. It is to be noted, however, that the appended drawings illustrate only typical embodiments of this invention, and are therefore, not to be considered limiting of its scope, for the invention may admit to other equally effective embodiments.

FIG. 6 is a sectional side view of another embodiment of a gas generation canister;

FIG. 7A illustrates a sectional view of a canister surrounded by a canister heater in accordance with one embodiment of the invention;

FIG. 7B illustrates a sectional view of a canister surrounded by a canister heater in accordance with another embodiment of the invention; and FIG. 8 illustrates a sectional view of a canister containing a plurality of solid particles in accordance with one embodiment of the invention.

DETAILED DESCRIPTION OF THE PREFERRED EMBODIMENT

Figure 1:
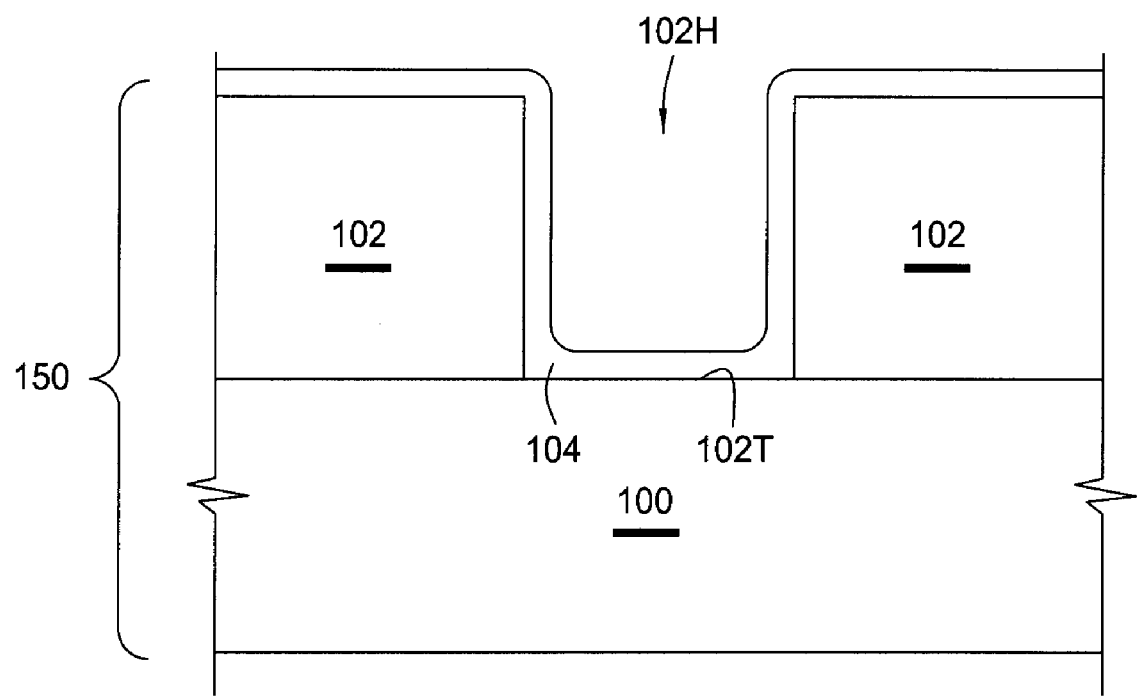
FIG. 1 is a schematic cross-sectional view of one embodiment of a barrier layer formed over a substrate by atomic layer deposition (ALD)

FIG. 1 is a schematic cross-sectional view of one embodiment of a substrate 100 having a dielectric layer 102 and a barrier layer 104 deposited thereon. Depending on the processing stage, the substrate 100 may be a silicon semiconductor substrate, or other material layer, which has been formed on the substrate. The dielectric layer 102 may be an oxide, a silicon oxide, carbon-silicon-oxide, a fluoro-silicon, a porous dielectric, or other suitable dielectric formed and patterned to provide a contact hole or via 102H extending to an exposed surface portion 102T of the substrate 100. For purposes of clarity, the substrate 100 refers to any work piece upon which film processing is performed, and a substrate structure 150 is used to denote the substrate 100 as well as other material layers formed on the substrate 100, such as the dielectric layer 102. It is also understood by those with skill in the art that the present invention may be used in a dual damascene process flow. The barrier layer 104 is formed over the substrate structure 150 of FIG. 1A by atomic layer deposition (ALD). Preferably, the barrier layer includes a tantalum nitride layer.

In one aspect, atomic layer deposition of a tantalum nitride barrier layer includes sequentially providing a tantalum containing compound and a nitrogen-containing compound to a process chamber. Sequentially providing a tantalum containing compound and a nitrogen-containing compound may result in the alternating chemisorption of monolayers of a tantalum-containing compound and of monolayers of a nitrogen-containing compound on the substrate structure 150.

Figure 2A:
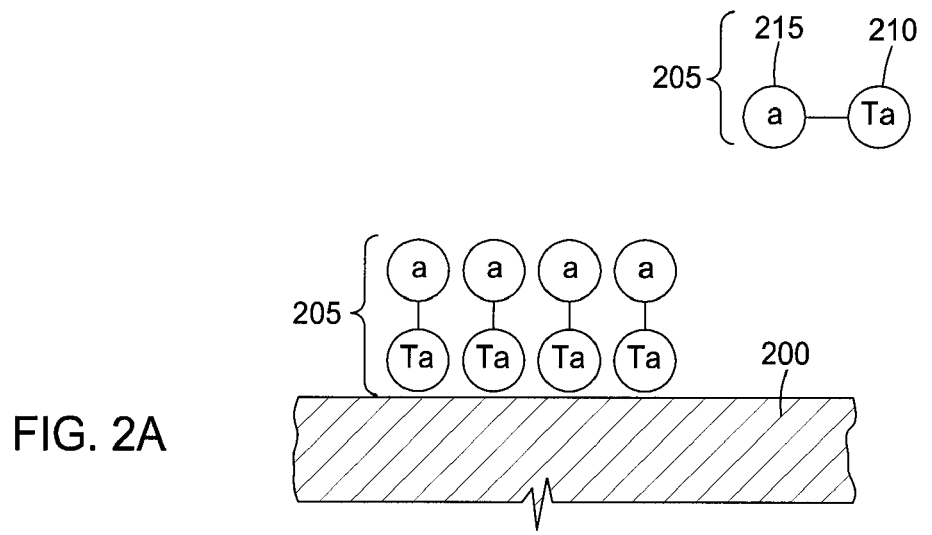
FIGS. 2A-2C illustrate one embodiment of the alternating chemisorption of monolayers of a tantalum containing compound and a nitrogen containing compound on an exemplary portion of substrate.
Figure 2B:
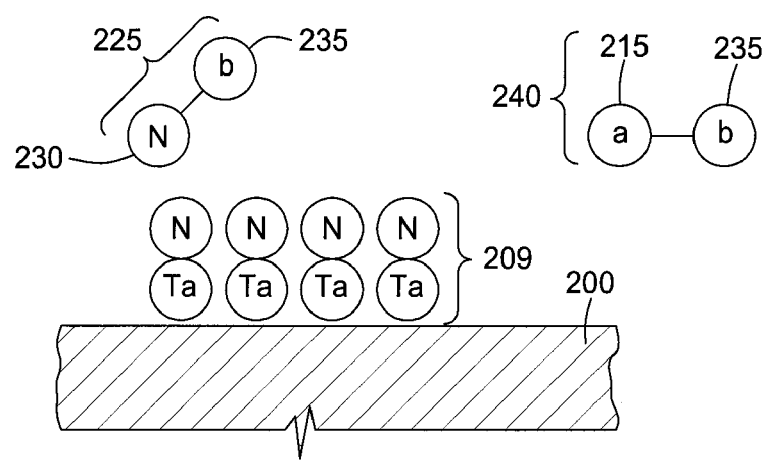
Figure 2C:
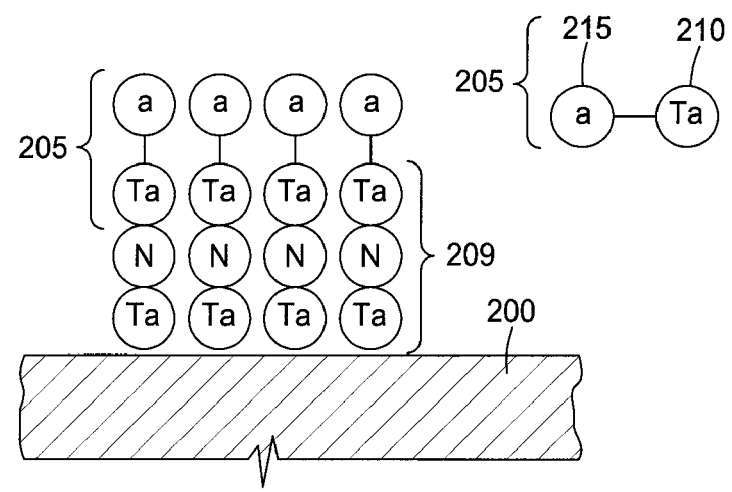

FIGS. 2A-2C illustrate one embodiment of the alternating chemisorption of monolayers of a tantalum containing compound and a nitrogen containing compound on an exemplary portion of substrate 200 in a stage of integrated circuit fabrication, and more particularly at a stage of barrier layer formation. In FIG. 2A, a monolayer of a tantalum containing compound is chemisorbed on the substrate 200 by introducing a pulse of the tantalum containing compound 205 into a process chamber.

The tantalum containing compound 205 typically includes tantalum atoms 210 with one or more reactive species 215. In one embodiment, the tantalum containing compound is pentakis(dimethylamido)tantalum (PDMAT; Ta(NMe$_2$)$_5$). PDMAT may be advantageously used for a number of reasons. PDMAT is relatively stable. In addition, PDMAT has an adequate vapor pressure which makes it easy to deliver. In particular, PDMAT may be produced with a low halide content. The halide content of PDMAT should be produced with a halide content of less than 100 ppm. Not wishing to be bound by theory, it is believed that an organometallic precursor with a low halide content is beneficial because halogens (such as chlorine) incorporated in the barrier layer may attack the copper layer deposited thereon.

Thermal decomposition of the PDMAT during production may cause impurities in the PDMAT product, which is subsequently used to form the tantalum nitride barrier layer. The impurities may include compounds such as CH$_3$NTa(N(CH$_3$)$_2$)$_3$ and ((CH$_3$)$_2$N)$_3$Ta(NCH$_2$CH$_3$). In addition, reactions with moisture may result in tantalum oxo amide compounds in the PDMAT product. Preferably, the tantalum oxo amide compounds are removed from the PDMAT by sublimation. For example, the tantalum oxo amide compounds are removed in a bubbler. The PDMAT product preferably has less than about 5 ppm of chlorine. In addition, the levels of lithium, iron, fluorine, bromine, and iodine should be minimized. Most preferably, the total level of impurities is less than about 5 ppm.

The tantalum containing compound may be provided as a gas or may be provided with the aid of a carrier gas. Examples of carrier gases which may be used include, but are not limited to, helium (He), argon (Ar), nitrogen (N$_2$), and hydrogen (H$_2$).

After the monolayer of the tantalum containing compound is chemisorbed onto the substrate 200, excess tantalum containing compound is removed from the process chamber by introducing a pulse of a purge gas thereto. Examples of purge gases which may be used include, but are not limited to, helium (He), argon (Ar), nitrogen (N$_2$), hydrogen (H$_2$), and other gases.

Referring to FIG. 2B, after the process chamber has been purged, a pulse of a nitrogen containing compound 225 is introduced into the process chamber. The nitrogen containing compound 225 may be provided alone or may be provided with the aid of a carrier gas. The nitrogen containing compound 225 may comprise nitrogen atoms 230 with one or more reactive species 235. The nitrogen containing compound preferably includes ammonia gas (NH$_3$). Other nitrogen containing compounds may be used which include, but are not limited to, N$_x$H$_y$ with x and y being integers (e.g., hydrazine (N$_2$H$_4$)), dimethyl hydrazine ((CH$_3$)$_2$N$_2$H$_2$), t-butylhydrazine (C$_4$H$_9$N$_2$H$_3$), phenylhydrazine (C$_6$H$_5$N$_2$H$_3$), other hydrazine derivatives, a nitrogen plasma source (e.g., N$_2$, N$_2$/H$_2$, NH$_3$, or a N$_2$H$_4$ plasma), 2,2'-azotertbutane ((CH$_3$)$_6$C$_2$N$_2$), ethylazide (C$_2$H$_5$N$_3$), and other suitable gases. A carrier gas may be used to deliver the nitrogen containing compound if necessary.

A monolayer of the nitrogen containing compound 225 may be chemisorbed on the monolayer of the tantalum containing compound 205. The composition and structure of precursors on a surface during atomic layer deposition (ALD) is not precisely known. Not wishing to be bound by theory, it is believed that the chemisorbed monolayer of the nitrogen containing compound 225 reacts with the monolayer of the tantalum containing compound 205 to form a tantalum nitride layer 209. The reactive species 215, 235 form by-products 240 that are transported from the substrate surface by the vacuum system.

After the monolayer of the nitrogen containing compound 225 is chemisorbed on the monolayer of the tantalum containing compound, any excess nitrogen containing compound is removed from the process chamber by introducing another pulse of the purge gas therein. Thereafter, as shown in FIG. 2C, the tantalum nitride layer deposition sequence of alternating chemisorption of monolayers of the tantalum containing compound and of the nitrogen containing compound may be repeated, if necessary, until a desired tantalum nitride thickness is achieved.

In FIGS. 2A-2C, the tantalum nitride layer formation is depicted as starting with the chemisorption of a monolayer of a tantalum containing compound on the substrate followed by a monolayer of a nitrogen containing compound. Alternatively, the tantalum nitride layer formation may start with the chemisorption of a monolayer of a nitrogen containing compound on the substrate followed by a monolayer of the tantalum containing compound. Furthermore, in an alternative embodiment, a pump evacuation alone between pulses of reactant gases may be used to prevent mixing of the reactant gases.

The time duration for each pulse of the tantalum containing compound, the nitrogen containing compound, and the purge gas is variable and depends on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill and will take longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for chemisorption of a monolayer of the compound. In general, the pulse time of the purge gas should be long enough to remove the reaction by-products and/or any residual materials remaining in the process chamber.

Generally, a pulse time of about 1.0 second or less for a tantalum containing compound and a pulse time of about 1.0 second or less for a nitrogen containing compound are typically sufficient to chemisorb alternating monolayers on a substrate. A pulse time of about 1.0 second or less for a purge gas is typically sufficient to remove reaction by-products as well as any residual materials remaining in the process chamber. Of course, a longer pulse time may be used to ensure chemisorption of the tantalum containing compound and the nitrogen containing compound and to ensure removal of the reaction by-products.

During atomic layer deposition, the substrate may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 Torr, preferably less than 50 Torr. When the tantalum containing gas is PDMAT, the heater temperature is preferably between about 100° C. and about 300° C., more preferably between about 175° C. and 250° C. In other embodiments, it should be understood that other temperatures may be used. For example, a temperature above a thermal decomposition temperature may be used. However, the temperature should be selected so that more than 50 percent of the deposition activity is by chemisorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition in a process chamber includes sequentially providing pentakis(dimethylamido)tantalum (PDMAT) at a flow rate between about 100 sccm (standard cubic centimeters per minute) and about 1,000 sccm, and preferably between about 200 sccm and 500 sccm, for a time period of about 1.0 second or less, providing ammonia at a flow rate between about 100 sccm and about 1,000 sccm, preferably between about 200 sccm and 500 sccm, for a time period of about 1.0 second or less, and a purge gas at a flow rate between about 100 sccm and about 1,000 sccm, preferably between about 200 sccm and 500 sccm for a time period of about 1.0 second or less. The heater temperature preferably is maintained between about 100° C. and about 300° C. at a chamber pressure between about 1.0 and about 5.0 Torr. This process provides a tantalum nitride layer in a thickness between about 0.5 Å and about 1.0 Å per cycle. The alternating sequence may be repeated until a desired thickness is achieved.

Figure 3:
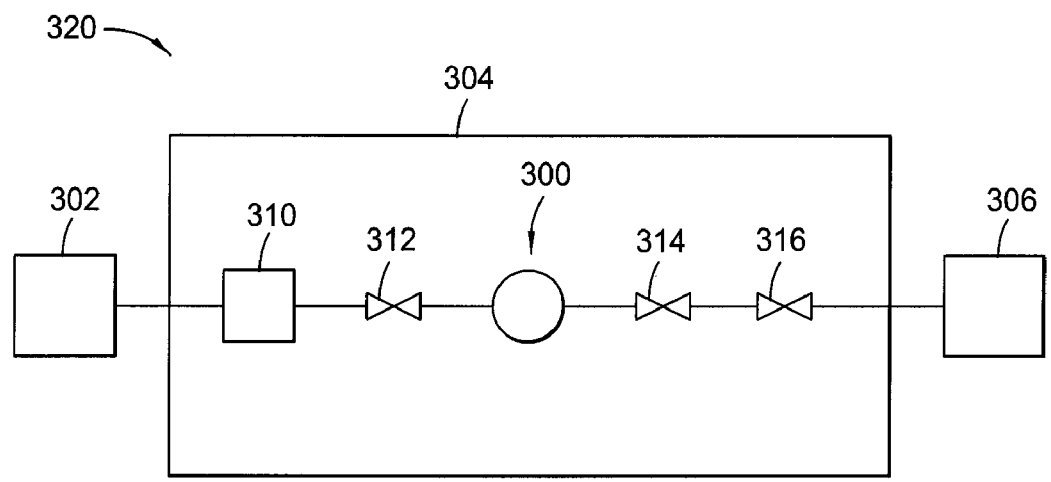
FIG. 3 is a schematic cross-sectional view of one exemplary embodiment of a processing system that may be used to form one or more barrier layers by atomic layer deposition.

FIG. 3 is a schematic cross-sectional view of one exemplary embodiment of a processing system 320 that may be used to form one or more barrier layers by atomic layer deposition in accordance with aspects of the present invention. Of course, other processing systems may also be used.

The processing system 320 generally includes a processing chamber 306 coupled to a gas delivery system 304. The processing chamber 306 may be any suitable processing chamber, for example, those available from Applied Materials, Inc., located in Santa Clara, Calif. Exemplary processing chambers include DPS CENTURA® etch chambers, PRODUCER® chemical vapor deposition chambers, and ENDURA® physical vapor deposition chambers, among others.

The gas delivery system 304 generally controls the rate and pressure at which various process and inert gases are delivered to the processing chamber 306. The number and types of process and other gases delivered to the processing chamber 306 are generally selected based on the process to be performed in the processing chamber 306 coupled thereto. Although for simplicity a single gas delivery circuit is depicted in the gas delivery system 304 shown in FIG. 3, it is contemplated that additional gas delivery circuits may be utilized.

The gas delivery system 304 is generally coupled between a carrier gas source 302 and the processing chamber 306. The carrier gas source 302 may be a local or remote vessel or a centralized facility source that supplies the carrier gas throughout the facility. The carrier gas source 302 typically supplies a carrier gas such as argon, nitrogen, helium, or other inert or non-reactive gas.

The gas delivery system 304 typically includes a flow controller 310 coupled between the carrier gas source 302 and a process gas source canister 300. The flow controller 310 may be a proportional valve, modulating valve, needle valve, regulator, mass flow controller or the like. One flow controller 310 that may be utilized is available from Sierra Instruments, Inc., located in Monterey, Calif.

The source canister 300 is typically coupled to and located between a first and a second valve 312, 314. In one embodiment, the first and second valves 312, 314 are coupled to the source canister 300 and fitted with disconnect fittings (not shown) to facilitate removal of the valves 312, 314 with the source canister 300 from the gas delivery system 304. A third valve 316 is disposed between the second valve 314 and the processing chamber 306 to prevent introduction of contaminates into the processing chamber 306 after removal of the source canister 300 from the gas delivery system 304.

Figure 4B:
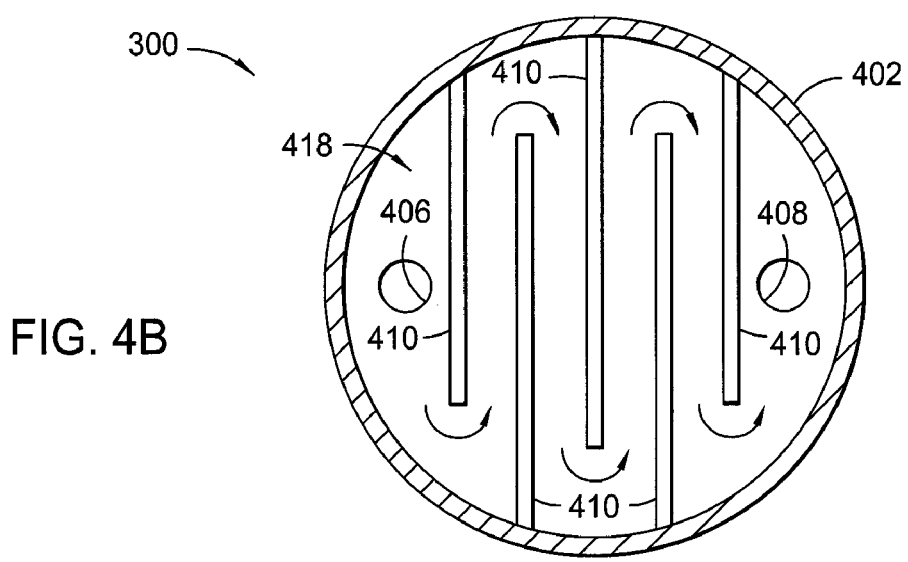
FIG. 4B is a sectional top view of another embodiment of a gas generation canister.
Figure 4A:
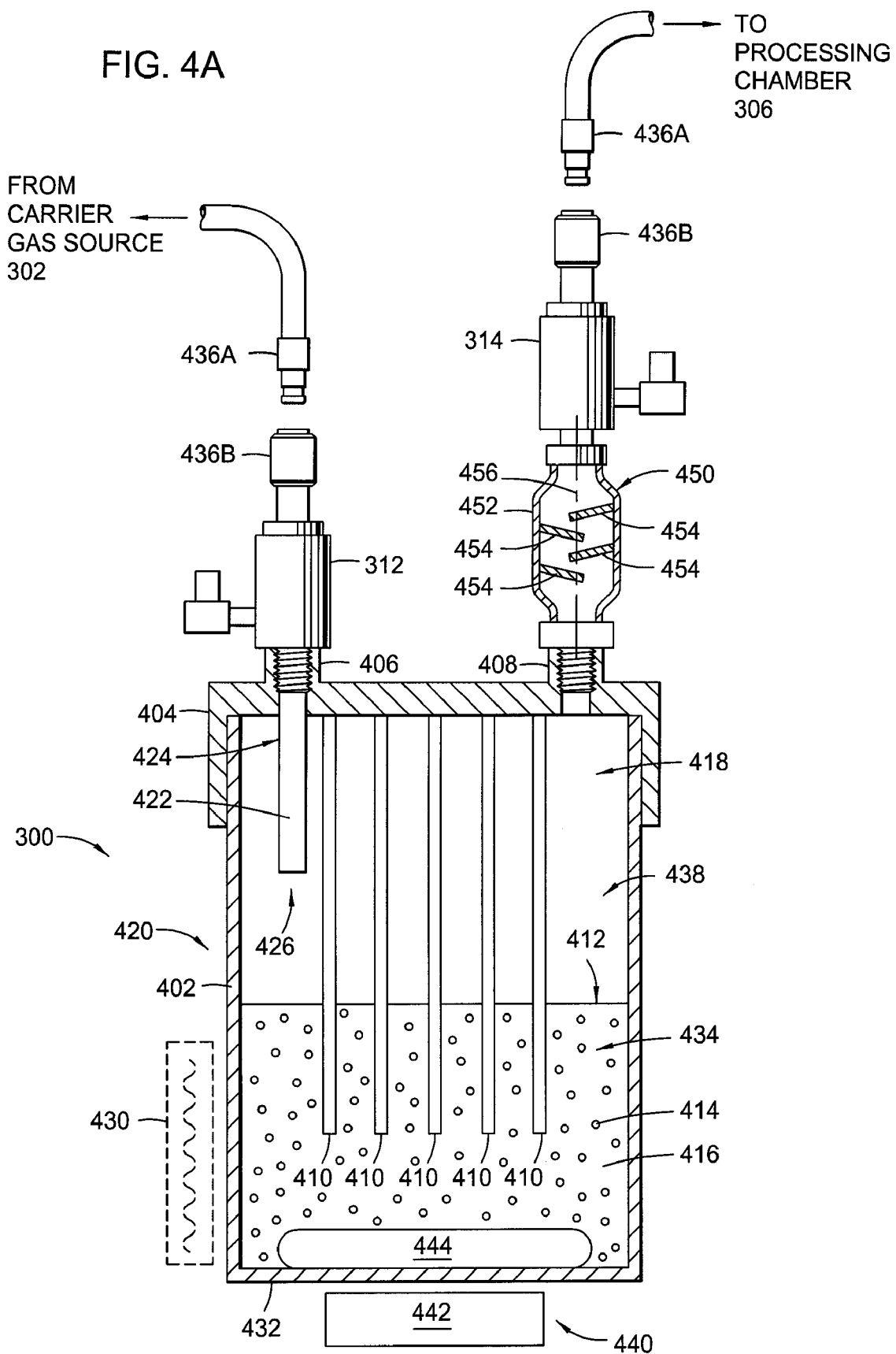
FIG. 4A is a sectional side view of one embodiment of a gas generation canister.
Figure 4C:
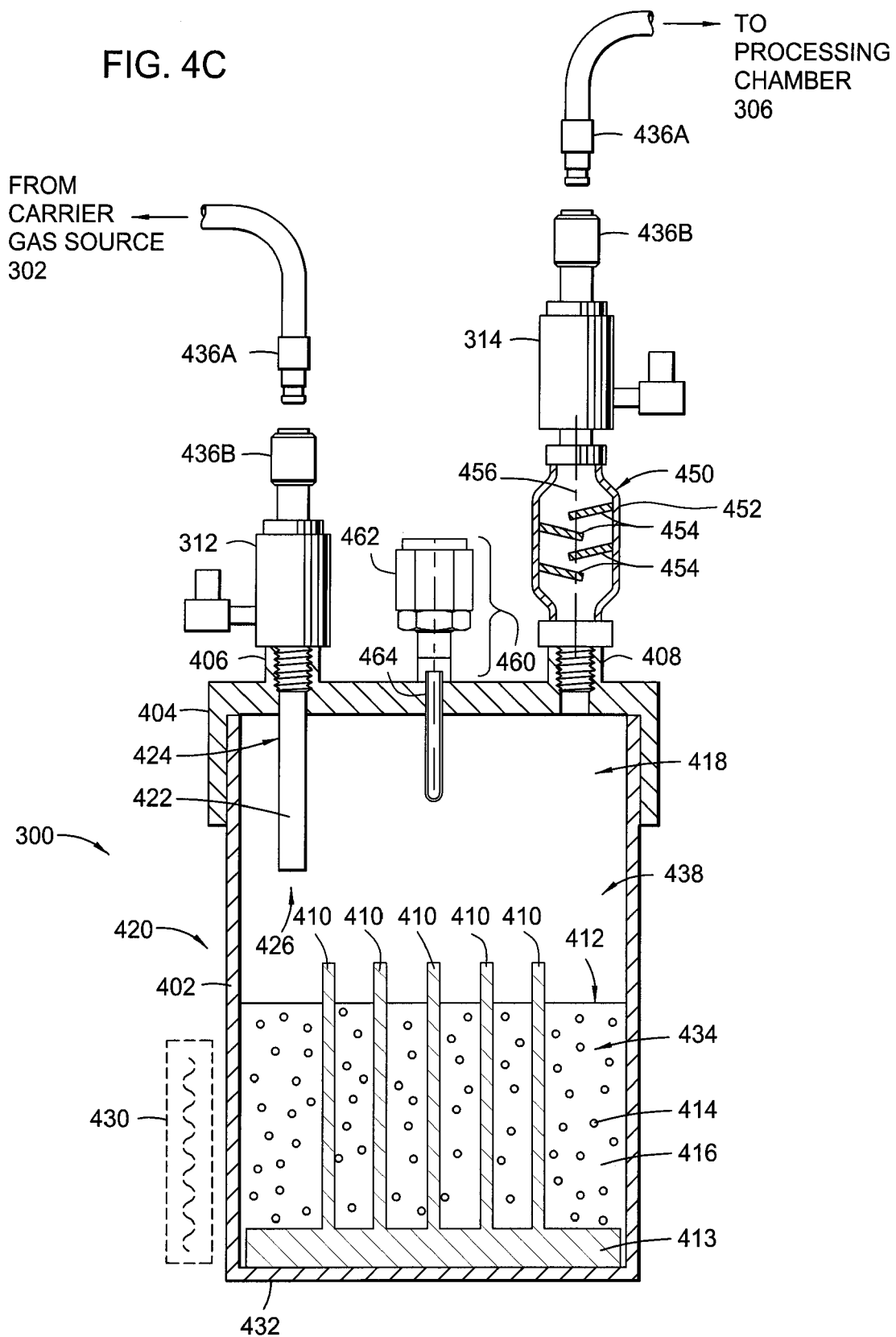
FIG. 4C is a sectional side view of another embodiment of a gas generation canister.

FIGS. 4A-4C depict sectional views of embodiments of the source canister 300. The source canister 300 generally comprises an ampoule or other sealed container having a housing 420 that is adapted to hold precursor materials 414 from which a process (or other) gas may be generated through a sublimation or vaporization process. Some solid precursor materials 414 that may generate a process gas in the source canister 300 through a sublimation process include xenon difluoride, nickel carbonyl, tungsten hexacarbonyl, and pentakis(dimethylamido) tantalum (PDMAT), among others. Some liquid precursor materials 414 that may generate a process gas in the source canister 300 through a vaporization process include tetrakis(dimethylamido) titanium (TDMAT), tertbutylimido tris(diethylamido)tantalum (TBTDET), and pentakis(ethylmethylamido)tantalum (PEMAT), among others. The housing 420 is generally fabricated from a material substantially inert to the precursor materials 414 and gas produced therefrom, and thus, the material of construction may vary based on gas being produced.

The housing 420 may have any number of geometric forms. In the embodiment depicted in FIGS. 4A-4C, the housing 420 comprises a cylindrical sidewall 402 and a bottom 432 sealed by a lid 404. The lid 404 may be coupled to the sidewall 402 by welding, bonding, adhesives, or other leak-tight method. Alternately, the joint between the sidewall 402 and the lid 404 may have a seal, o-ring, gasket, or the like, disposed therebetween to prevent leakage from the source canister 300. The sidewall 402 may alternatively comprise other hollow geometric forms, for example, a hollow square tube.

An inlet port 406 and an outlet port 408 are formed through the source canister to allow gas flow into and out of the source canister 300. The ports 406, 408 may be formed through the lid 404 and/or sidewall 402 of the source canister 300. The ports 406, 408 are generally sealable to allow the interior of the source canister 300 to be isolated from the surrounding environment during removal of the source canister 300 from the gas delivery system 304. In one embodiment, valves 312, 314 are sealingly coupled to ports 406, 408 to prevent leakage from the source canister 300 when removed from the gas delivery system 304 (shown in FIG. 3) for recharging of the precursor material 414 or replacement of the source canister 300. Mating disconnect fittings 436A, 436B may be coupled to valves 312, 314 to facilitate removal and replacement of the source canister 300 to and from the gas delivery system 304. Valves 312, 314 are typically ball valves or other positive sealing valves that allow the source canister 300 to be removed from the system efficiently loaded and recycled while minimizing potential leakage from the source canister 300 during filling, transport, or coupling to the gas delivery system 304. Alternatively, the source canister 300 can be refilled through a refill port 460 such as a small tube 464 with a VCR fitting 462 disposed on the lid 404 of the source canister 300, as depicted in FIG. 4C.

The source canister 300 has an interior volume 438 having an upper region 418 and a lower region 434. The lower region 434 of source canister 300 is at least partially filled with the precursor materials 414. Alternately, a liquid 416 may be added to a solid precursor material 414 to form a slurry 412. The precursor materials 414, the liquid 416, or the premixed slurry 412 may be introduced into source canister 300 by removing the lid 404 or through one of the ports 406, 408. The liquid 416 is selected such that the liquid 416 is non-reactive with the precursor materials 414, that the precursor materials 414 are insoluble therein, that the liquid 416 has a negligible vapor pressure compared to the precursor materials 414, and that the ratio of the vapor pressure of the solid precursor material 414, e.g., tungsten hexacarbonyl, to that of the liquid 416 is greater than 103.

Precursor materials 414 mixed with the liquid 416 may be sporadically agitated to keep the precursor materials 414 suspended in the liquid 416 in the slurry 412. In one embodiment, precursor materials 414 and the liquid 416 are agitated by a magnetic stirrer 440. The magnetic stirrer 440 includes a magnetic motor 442 disposed beneath the bottom 432 of the source canister 300 and a magnetic pill 444 disposed in the lower region 434 of the source canister 300. The magnetic motor 442 operates to rotate the magnetic pill 444 within the source canister 300, thereby mixing the slurry 412. The magnetic pill 444 should have an outer coating of material that is a non-reactive with the precursor materials 414, the liquid 416, or the source canister 300. Suitable magnetic mixers are commercially available. One example of a suitable magnetic mixer is IKAMAG® REO available from IKA® Works in Wilmington, N.C. Alternatively, the slurry 412 may be agitated other means, such as by a mixer, a bubbler, or the like.

The agitation of the liquid 416 may induce droplets of the liquid 416 to become entrained in the carrier gas and carried toward the processing chamber 306. To prevent such droplets of liquid 416 from reaching the processing chamber 306, an oil trap 450 may optionally be coupled to the exit port 408 of the source canister 300. The oil trap 450 includes a body 452 containing a plurality of interleaved baffles 454 which extend past a centerline 456 of the oil trap body 452 and are angled at least slightly downward towards the source canister 300. The baffles 454 force the gas flowing towards the processing chamber 306 to flow a tortuous path around the baffles 454. The surface area of the baffles 454 provides a large surface area exposed to the flowing gas to which oil droplets that may be entrained in the gas adhere. The downward angle of the baffles 454 allows any oil accumulated in the oil trap to flow downward and back into the source canister 300.

The source canister 300 includes at least one baffle 410 disposed within the upper region 418 of the source canister 300, per one embodiment depicted in FIG. 4A. The baffle 410 is disposed between inlet port 406 and outlet port 408, creating an extended mean flow path, thereby preventing direct (i.e., straight line) flow of the carrier gas from the inlet port 406 to the outlet port 408. This has the effect of increasing the mean dwell time of the carrier gas in the source canister 300 and increasing the quantity of sublimated or vaporized precursor gas carried by the carrier gas. Additionally, the baffles 410 direct the carrier gas over the entire exposed surface of the precursor material 414 disposed in the source canister 300, ensuring repeatable gas generation characteristics and efficient consumption of the precursor material 414.

The number, spacing, and shape of the baffles 410 may be selected to tune the source canister 300 for optimum generation of precursor gas. For example, a greater number of baffles 410 may be selected to impart higher carrier gas velocities at the precursor material 414 or the shape of the baffles 410 may be configured to control the consumption of the precursor material 414 for more efficient usage of the precursor material.

The baffle 410 may be attached to the sidewall 402 (FIG. 4B), the lid 404 (FIG. 4A), or the baffle 410 may be a prefabricated insert 413 designed to fit within the source canister 300 (FIG. 4C). In one embodiment, the baffles 410 disposed in the source canister 300 comprise five rectangular plates fabricated of the same material as the sidewall 402. Referring to FIG. 4B, the baffles 410 are welded or otherwise fastened to the sidewall 402 parallel to each other. The baffles 410 are interleaved, fastened to opposing sides of the source canister in an alternating fashion, such that a serpentine extended mean flow path is created. Furthermore, the baffles 410 are situated between the inlet port 406 and the outlet port 408 on the lid 404 when placed on the sidewall 402 and are disposed such that there is no air space between the baffles 410 and the lid 404. The baffles 410 additionally extend at least partially into the lower region 434 of the source canister 300, thus defining an extended mean flow path for the carrier gas flowing through the upper region 418.

Optionally, an inlet tube 422 may be disposed in the interior volume 438 of the source canister 300. The tube 422 is coupled by a first end 424 to the inlet port 406 of the source canister 300 and terminates at a second end 426 in the upper region 418 of the source canister 300. The tube 422 injects the carrier gas into the upper region 418 of the source canister 300 at a location closer to the precursor materials 414 or the slurry 412.

The precursor materials 414 generate a precursor gas at a predefined temperature and pressure. Sublimating or vaporized gas from the precursor materials 414 accumulate in the upper region 418 of the source canister 300 and are swept out by an inert carrier gas entering through inlet port 406 and exiting outlet port 408 to be carried to the processing chamber 306. In one embodiment, the precursor materials 414 are heated to a predefined temperature by a resistive heater 430 disposed proximate to the sidewall 402. Alternately, the precursor materials 414 may be heated by other means, such as by a cartridge heater (not shown) disposed in the upper region 418 or the lower region 434 of the source canister 300 or by preheating the carrier gas with a heater (not shown) placed upstream of the carrier gas inlet port 406. To maximize uniform heat distribution throughout the slurry 412, the liquid 416 and the baffles 410 should be good conductors of heat.

In accordance with yet another embodiment of the invention, a plurality of solid beads or particles 810 with high thermal conductivity, such as, aluminum nitride or boron nitride, may be used in lieu of the liquid 416, as shown in FIG. 8. Such solid particles 810 may be used to transfer more heat from the sidewall of the canister 800 to the precursor materials 414 than the liquid 416. The solid particles 810 have the same properties as the liquid 416 in that they are non-reactive with the precursor materials 414, insoluble, have a negligible vapor pressure compared to the precursor materials 414. As such, the solid particles 810 are configured to efficiently transfer heat from the sidewall of the canister 800 to the center portion of the canister 800, thereby leading to more precursor material utilization during sublimation or vaporization. The solid particles 810 may also be degassed and cleaned from contaminants, water vapor and the like, prior to being deposited into the canister 800.

In one exemplary mode of operation, the lower region 434 of the source canister 300 is at least partially filled with a mixture of tungsten hexacarbonyl and diffusion pump oil to form the slurry 412. The slurry 412 is held at a pressure of about 5 Torr and is heated to a temperature in the range of about 40° C. to about 50° C. by a resistive heater 430 located proximate to the source canister 300. Carrier gas in the form of argon is flowed through inlet port 406 into the upper region 418 at a rate of about 400 sccm. The argon flows in an extended mean flow path defined by the torturous path through the baffles 410 before exiting the source canister 300 through outlet port 408, advantageously increasing the mean dwell time of the argon in the upper region 418 of the source canister 300. The increased dwell time in the source canister 300 advantageously increases the saturation level of sublimated tungsten hexacarbonyl vapors within the carrier gas. Moreover, the torturous path through the baffles 410 advantageously exposes the substantially all of the exposed surface area of the precursor material 414 to the carrier gas flow for uniform consumption of the precursor material 414 and generation of the precursor gas.

FIGS. 7A-7B illustrate other embodiments for heating the precursor materials 414. More specifically, FIGS. 7A-7B illustrate a sectional view of a canister 700 surrounded by a canister heater 730, which is configured to create a temperature gradient between a lower region 434 of the canister 700 and an upper region 418 of the canister 700 with the lower region 434 being the coldest region and the upper region 418 being the hottest region. The temperature gradient may range from about 5° C. to about 15° C. Since solid precursor materials generally tend to accumulate or condense at the coldest region of the canister 700, the canister heater 730 is configured to ensure that the solid precursor materials 414 will accumulate at the lower region 434 of the canister 700, thereby increasing the predictability of where the solid precursor materials 414 will condense and the temperature of the solid precursor materials 414. The canister heater 730 includes a heating element 750 disposed inside the canister heater 730 such that the entire canister 700, including the upper region 418 and the lower region 434, is heated by the canister heater 730. The heating element 750 near the upper region 418 may be configured to generate more heat than the heating element 750 near the lower region 434, thereby allowing the canister heater 730 to create the temperature gradient between the lower region 434 and the upper region 418. In one embodiment, the heating element 750 is configured such that the temperature at the upper region 418 is between about 5° C. to about 15° C. higher than the temperature at the lower region 434. In another embodiment, the heating element 750 is configured such that the temperature at the upper region 418 is about 70° C., the temperature at the lower region 434 is about 60° C. and the temperature at the sidewall of the canister 700 is about 65° C. The power of the heating element 730 may be about 600 watts at 208 VAC input.

The canister heater 730 may also include a cooling plate positioned at the bottom of the canister heater 730 to further ensure that the coldest region of the canister 700 is the lower region 434, and thereby ensuring that the solid precursor materials 414 condense at the lower region 434. Further, the valves 312, 314, the oil trap 450, the inlet port 406 and the exit port 408 may be heated with a resistive heating tape. Since the upper region 418 is configured to have a higher temperature than the lower region 434, the baffles 410 may be used to transfer heat from the upper region 418 to the lower region 434, thereby allowing the canister heater 730 to maintain the desired temperature gradient. Embodiments of the invention also contemplate other heat transfer mediums, such as, silos 710 extending from the bottom portion 432 of the canister 700 to the upper region 418, as depicted in FIG. 7B.

Figure 5:
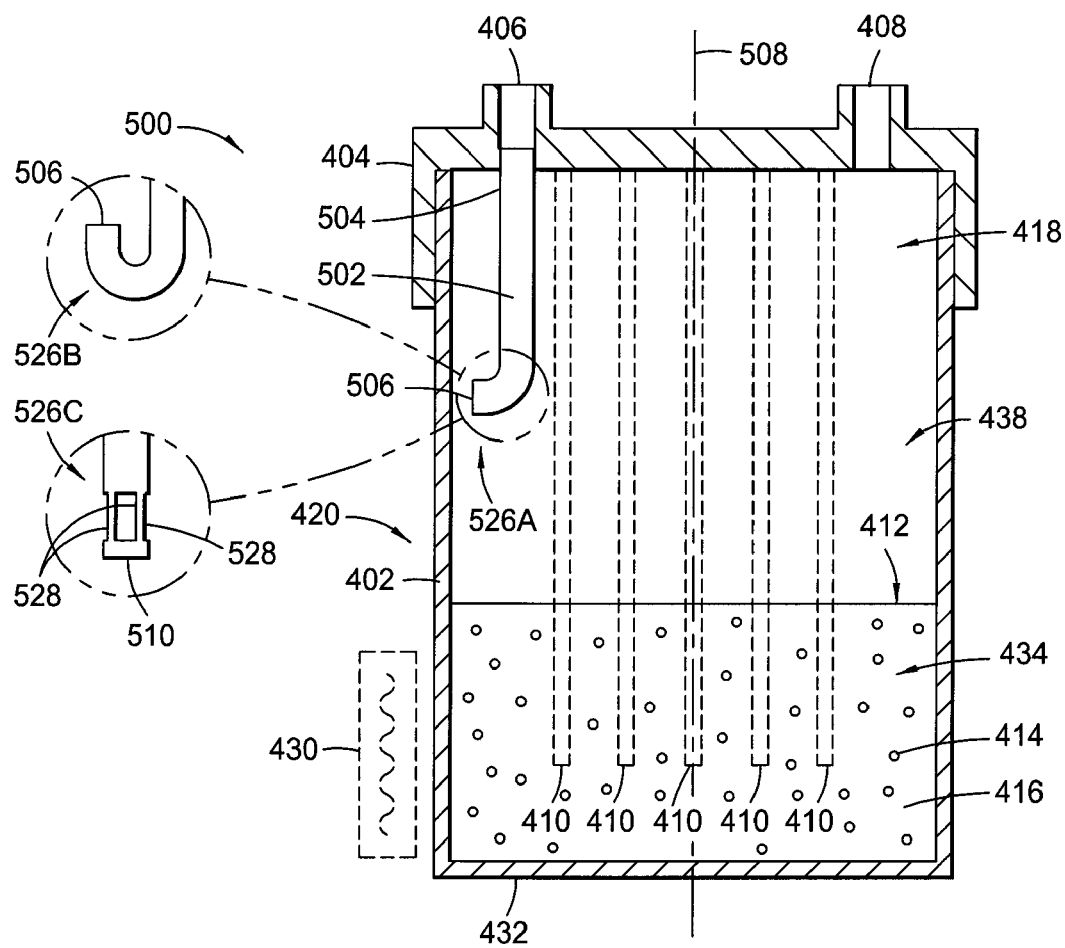
FIG. 5 is a sectional view of another embodiment of a gas generation canister.

FIG. 5 depicts a sectional view of another embodiment of a canister 500 for generating a process gas. The canister 500 includes a sidewall 402, a lid 404 and a bottom 432 enclosing an interior volume 438. At least one of the lid 404 or sidewall 402 contains an inlet port 406 and an outlet port 408 for gas entry and egress. The interior volume 438 of the canister 500 is split into an upper region 418 and a lower region 434. Precursor materials 414 at least partially fill the lower region 434. The precursor materials 414 may be in the form of a solid, liquid, or slurry, and are adapted to generate a process gas by sublimation and/or vaporization.

A tube 502 is disposed in the interior volume 438 of the canister 500 and is adapted to direct a flow of gas within the canister 500 away from the precursor materials 414, advantageously preventing gas flowing out of the tube 502 from directly impinging the precursor materials 414 and causing particulates to become airborne and carried through the outlet port 408 and into the processing chamber 306. The tube 502 is coupled at a first end 504 to the inlet port 406. The tube 502 extends from the first end 504 to a second end 526A that is positioned in the upper region 418 above the precursor materials 414. The second end 526A may be adapted to direct the flow of gas toward the sidewall 402, thus preventing direct (linear or line of sight) flow of the gas through the canister 500 between the ports 406, 408, creating an extended mean flow path.

In one embodiment, an outlet 506 of the second end 526A of the tube 502 is oriented at an angle of about 15° to about 90° relative to a center axis 508 of the canister 500. In another embodiment, the tube 502 has a 'J'-shaped second end 526B that directs the flow of gas exiting the outlet 506 towards the lid 404 of the canister 500. In another embodiment, the tube 502 has a capped second end 526C having a plug or cap 510 closing the end of the tube 502. The capped second end 526C has at least one opening 528 formed in the side of the tube 502 proximate the cap 510. Gas, exiting the openings 528, is typically directed perpendicular to the center axis 508 and away from the precursor materials 414 disposed in the lower region 434 of the canister 500. Optionally, at least one baffle 410 (shown in phantom) as described above may be disposed within the chamber 500 and utilized in tandem with any of the embodiments of the tube 502 described above.

In one exemplary mode of operation, the lower region 434 of the canister 500 is at least partially filled with a mixture of tungsten hexacarbonyl and diffusion pump oil to form the slurry 412. The slurry 412 is held at a pressure of about 5 Torr and is heated to a temperature in the range of about 40° C. to about 50° C. by a resistive heater 430 located proximate to the canister 500. A carrier gas in the form of argon is flowed through the inlet port 406 and the tube 502 into the upper region 418 at a rate of about 200 sccm. The second end 526A of the tube 502 directs the flow of the carrier gas in an extended mean flow path away from the outlet port 408, advantageously increasing the mean dwell time of the argon in the upper region 418 of the canister 500 and preventing direct flow of carrier gas upon the precursor materials 414 to minimize particulate generation. The increased dwell time in the canister 500 advantageously increases the saturation level of sublimated tungsten hexacarbonyl gas within the carrier gas while the decrease in particulate generation improves product yields, conserves source solids, and reduces downstream contamination.

FIG. 6 depicts a sectional view of another embodiment of a canister 600 for generating a precursor gas. The canister 600 includes a sidewall 402, a lid 404, and a bottom 432 enclosing an interior volume 438. At least one of the lid 404 or sidewall 402 contains an inlet port 406 and an outlet port 408 for gas entry and egress. Inlet and outlet ports 406, 408 are coupled to valves 312, 314 fitted with mating disconnect fittings 436A, 436B to facilitate removal of the canister 600 from the gas delivery system 304. Optionally, an oil trap 450 is coupled between the outlet port 408 and the valve 314 to capture any oil particulate that may be present in the gas flowing to the process chamber 306.

The interior volume 438 of the canister 600 is split into an upper region 418 and a lower region 434. Precursor materials 414 and a liquid 416 at least partially fill the lower region 434. A tube 602 is disposed in the interior volume 438 of the canister 600 and is adapted to direct a first gas flow $F_1$ within the canister 600 away from the precursor material and liquid mixture and to direct a second gas flow $F_2$ through the mixture. The flow $F_1$ is much greater than the flow $F_2$. The flow $F_2$ is configured to act as a bubbler, being great enough to agitate the precursor material and liquid mixture but not enough to cause particles or droplets of the precursor materials 414 or liquid 416 from becoming airborne. Thus, this embodiment advantageously agitates the precursor material and liquid mixture while minimizing particulates produced due to direct impingement of the gas flowing out of the tube 602 on the precursor materials 414 from becoming airborne and carried through the outlet port 408 and into the processing chamber 306.

The tube 602 is coupled at a first end 604 to the inlet port 406. The tube 602 extends from the first end 604 to a second end 606 that is positioned in the lower region 434 of the canister 600, within the precursor material and liquid mixture. The tube 602 has an opening 608 disposed in the upper region 418 of the canister 600 that directs the first gas flow $F_1$ towards a sidewall 402 of the canister 600. The tube 600 has a restriction 610 disposed in the upper region 438 of the canister 600 located below the opening 608. The restriction 610 serves to decrease the second gas flow $F_2$ flowing toward the second end 606 of the tube 602 and into the slurry 412. By adjusting the amount of the restriction, the relative rates of the first and second gas flows $F_1$ and $F_2$ can be regulated. This regulation serves at least two purposes. First, the second gas flow $F_2$ can be minimized to provide just enough agitation to maintain suspension or mixing of the precursor materials 414 in the liquid 416 while minimizing particulate generation and potential contamination of the processing chamber 306. Second, the first gas flow $F_1$ can be regulated to maintain the overall flow volume necessary to provide the required quantity of sublimated and/or vapors from the precursor materials 414 to the processing chamber 306.

Optionally, an at least one baffle 410 as described above may be disposed within the canister 600 and utilized in tandem with any of the embodiments of the tube 602 described above.

While foregoing is directed to the preferred embodiment of the present invention, other and further embodiments of the invention may be devised without departing from the basic scope thereof, and the scope thereof is determined by the claims that follow.

The invention claimed is:

1. An apparatus for generating a chemical precursor used in a vapor deposition processing system, comprising:
   a canister having a sidewall, a top, and a bottom providing an interior volume;
   a precursor material at least partially filling the interior volume of the canister;
   an inlet port and an outlet port in fluid communication with the interior volume; and
   a plurality of silos within the interior volume, wherein the silos extend from the bottom and form an extended mean flow path between the inlet port and the outlet port.

2. The apparatus of claim 1, wherein the silos extend from the bottom of the canister to an upper portion of the interior volume.

3. The apparatus of claim 1, wherein the silos are baffles.

4. The apparatus of claim 3, wherein the baffles comprise of rectangular plates.

5. The apparatus of claim 3, wherein the baffles are a prefabricated insert positioned on the bottom of the canister.

6. The apparatus of claim 5, wherein the baffles extend into an upper portion of the interior volume.

7. The apparatus of claim 1, wherein an inlet tube extends from the inlet port into the canister.

8. The apparatus of claim 7, wherein the inlet tube extends from the inlet port to a lower region of the interior region.

9. The apparatus of claim 7, wherein the silos are positioned substantially parallel to the inlet tube.

10. The apparatus of claim 7, wherein the silos extend from the bottom of the canister to an upper portion of the interior volume.

11. The apparatus of claim 7, wherein the inlet tube comprises an outlet end within the interior region.

12. The apparatus of claim 11, wherein the outlet end is adapted to direct a gas flow towards the sidewall of the canister.

13. The apparatus of claim 11, wherein the outlet end is adapted to direct a gas flow towards the top of the canister.

14. The apparatus of claim 11, wherein the outlet end is adapted to direct a gas flow away from the outlet port.

15. The apparatus of claim 1, wherein a heater is coupled to the canister.

16. The apparatus of claim 15, wherein the heater is disposed proximate the sidewall of the canister, the top of the canister, the bottom of the canister, or combinations thereof.

17. The apparatus of claim 1, wherein the canister comprises a heat transfer medium within the interior volume.

18. The apparatus of claim 17, wherein the heat transfer medium is at least one of the silos.

19. The apparatus of claim 17, wherein the heat transfer medium is a plurality of solid particles at least partially filling the interior volume.

20. The apparatus of claim 19, wherein the solid particles are metal-containing particles.

21. The apparatus of claim 19, wherein the solid particles comprise a material selected from the group consisting of aluminum nitride, boron nitride, derivatives thereof, and combinations thereof.

22. The apparatus of claim 1, wherein the precursor material is a tantalum precursor.

23. The apparatus of claim 22, wherein the precursor material is pentakis(dimethylamido) tantalum.

24. The apparatus of claim 22, wherein the precursor material comprises chlorine impurities of less than 5 ppm.

25. An apparatus for generating a chemical precursor used in a vapor deposition processing system, comprising:
   a canister having a sidewall, a top, and a bottom providing an interior volumes, wherein the canister comprises a plurality of solid particles at least partially filing the interior volume;
   an inlet port and an outlet port in fluid communication with the interior volume;
   an inlet tube extending from the inlet port into the canister; and
   a plurality of baffles within the interior volume, wherein the baffles extend from the bottom.

26. The apparatus of claim 25, wherein the baffles form an extended mean flow path between the inlet port and the outlet port.

27. The apparatus of claim 25, wherein the baffles comprise of rectangular plates.

28. The apparatus of claim 25, wherein the baffles are silos.

29. The apparatus of claim 28, wherein the silos extend from the bottom of the canister to an upper portion of the interior volume.

30. The apparatus of claim 25, wherein the baffles are a prefabricated insert positioned on the bottom of the canister.

31. The apparatus of claim 30, wherein the baffles extend into an upper portion of the interior volume.

32. The apparatus of claim 25, wherein the inlet tube extends from the inlet port to a lower region of the interior region.

33. The apparatus of claim 32, wherein the baffles are positioned substantially parallel to the inlet tube.

34. The apparatus of claim 32, wherein the inlet tube comprises an outlet end within the interior region.

35. The apparatus of claim 34, wherein the outlet end is adapted to direct a gas flow towards the sidewall of the canister.

36. The apparatus of claim 34, wherein the outlet end is adapted to direct a gas flow towards the top of the canister.

37. The apparatus of claim 34, wherein the outlet end is adapted to direct a gas flow away from the outlet port.

38. The apparatus of claim 25, wherein the solid particles are metal-containing particles.

39. The apparatus of claim 38, wherein the canister further contains a tantalum precursor.

40. The apparatus of claim 39, wherein the tantalum precursor is pentakis (dimethylamido) tantalum.

41. The apparatus of claim 39, wherein the tantalum precursor and metal-containing particles form a precursor mixture.

42. An apparatus for generating a chemical precursor used in a vapor deposition processing system, comprising:
   a canister having a sidewall, a top, and a bottom providing an interior volume, wherein the canister comprises a plurality of solid particles at least partially filling the interior volume;
   an inlet port and an outlet port in fluid communication with the interior volume;
   an inlet tube extending from the inlet port into the canister; and
   a prefabricated insert positioned on the bottom of the canister and comprising a plurality of baffles.

43. The apparatus of claim 42, wherein the baffles form an extended mean flow path between the inlet port and the outlet port and extend from the bottom of the canister to an upper portion of the interior volume.

44. The apparatus of claim 42, wherein the solid particles are metal-containing particles.

45. The apparatus of claim 44, further comprising a tantalum precursor.

46. The apparatus of claim 45, wherein the tantalum precursor is pentakis(dimethylamido) tantalum.

47. The apparatus of claim 45, wherein the tantalum precursor and metal-containing particles form a precursor mixture.

48. An apparatus for generating a chemical precursor used in a vapor deposition processing system, comprising:
   a canister containing an interior volume and having a bottom surface therein;
   an inlet port and an outlet port in fluid communication with the interior volume;
   an inlet tube extending from the inlet port into the canister;
   a plurality of baffles extending from the bottom surface; and
   a precursor mixture comprising a tantalum precursor and a plurality of metal-containing particles, wherein the precursor mixture at least partially fills the interior volume.

49. The apparatus of claim 48, wherein the tantalum precursor is pentakis(dimethylamido) tantalum.

50. An apparatus for generating a chemical precursor used in a vapor deposition processing system, comprising:
   a canister containing an interior volume and having a bottom surface therein;
   an inlet port and an outlet port in fluid communication with the interior volume;
   an inlet tube extending from the inlet port into the canister;
   a prefabricated insert positioned within the canister and comprising a plurality of baffles extending from the bottom surface; and
   a precursor mixture comprising a tantalum precursor and a plurality of metal-containing particles, wherein the precursor mixture at least partially fills the interior volume.

51. The apparatus of claim 50, wherein the tantalum precursor is pentakis(dimethylamido) tantalum.

* * * * *

UNITED STATES PATENT AND TRADEMARK OFFICE
CERTIFICATE OF CORRECTION

| | |
|---|---|
| PATENT NO. | : 7,588,736 B2 |
| APPLICATION NO. | : 11/383642 |
| DATED | : September 15, 2009 |
| INVENTOR(S) | : Chen et al. |

It is certified that error appears in the above-identified patent and that said Letters Patent is hereby corrected as shown below:

Column 13, Claim 25, Line 28, please delete "volumes" and insert --volume-- therefor.

Signed and Sealed this

Tenth Day of November, 2009

David J. Kappos
*Director of the United States Patent and Trademark Office*